United States Patent
Kahng et al.

[11] 3,945,031
[45] Mar. 16, 1976

[54] CHARGE EFFECTS IN DOPED SILICON DIOXIDE

[75] Inventors: Dawon Kahng, Bridgewater; Joseph Raymond Ligenza, Califon, both of N.J.

[73] Assignee: Bell Telephone Laboratories, Incorporated, Murray Hill, N.J.

[22] Filed: July 7, 1975

[21] Appl. No.: 593,696

Related U.S. Application Data

[63] Continuation-in-part of Ser. No. 423,289, Dec. 10, 1973, abandoned.

[52] U.S. Cl................................. 357/23; 357/52
[51] Int. Cl.² ................... H01L 29/78; H01L 29/34
[58] Field of Search............................. 357/23, 52, 91

[56] References Cited
UNITED STATES PATENTS
3,882,530  5/1975  Danchenko........................... 357/23

Primary Examiner—Stanley D. Miller, Jr.
Assistant Examiner—E. Wojciechowicz
Attorney, Agent, or Firm—D. I. Caplan

[57] ABSTRACT

Charge conditions are modified in a wafer including a silicon dioxide layer on a silicon substrate by introducing a distribution of tantalum into the silicon dioxide layer. The distribution of tantalum can be adapted to store negative charge, to getter sodium or to produce nonannealable fast surface states. A distribution of tantalum at the silicon-silicon dioxide interface produces nonannealable fast surface states. A distribution of tantalum in the silicon dioxide subjected to electrical and temperature stress can store negative charge and getter sodium. An n-channel insulated gate field effect transistor utilizes a silicon dioxide gate insulator which includes centrally located therein a region which is rich in treated tantalum.

12 Claims, 3 Drawing Figures

CHARGE EFFECTS IN DOPED SILICON DIOXIDE

CROSS REFERENCE TO RELATED APPLICATION

This application is a continuation-in-part of our co-pending application, Ser. No. 423,289, filed Dec. 10, 1973, now abandoned.

FIELD OF THE INVENTION

This invention relates to semiconductor apparatus, and more particularly to means for modifying the charge conditions in a semiconductor wafer including a silicon dioxide layer.

BACKGROUND OF THE INVENTION

An undesirable electrical instability due to positive sodium ions often results in silicon semiconductor devices subjected to an oxidizing process. It would be desirable to remove, or getter, such ions in a simple processing step without adversely affecting any characteristics of the device.

The prior art teachings of sodium gettering include U.S. Pat. No. 3,529,347 issued to R. Ingless et al. on Sept. 22, 1970. The patent discloses applying a thin layer of phosphorous glass over an oxide, removing the layer after a short period of high temperature sodium gettering, and then keeping the temperature of the oxide low enough to avoid recontamination with sodium during subsequent processing. It would be desirable to eliminate the step of removing the gettering agent, and it would also be desirable to getter after subsequent processing steps without again introducing a gettering agent. Accordingly, it would be desirable to use a gettering agent at a concentration sufficiently low so as not to affect the chemical and mechanical properties of silicon dioxide, in order that the gettering agent should not require removal. Moreover the technique of gas-gettering with hydrochloric acid (HC1) vapor suffers from HC1 corrosion of the equipment.

Fabricating semiconductor devices includes such techniques as creating regions of stored charge. For example, stored positive charge has been used in the fabrication of a variety of metal-oxide-semiconductor (MOS) devices. In particular, a stable negative charge distribution would be desirable in certain n-channel MOS devices, such as n-channel transistors; but the production of such a charge distribution has presented difficulties.

The prior art teachings of storing charge in an oxide layer include U.S. Pat. No. 3,796,932, issued to G. F. Amelio et al. on Mar. 12, 1974, and U.S. Pat. No. 3,877,054, issued to D. M. Boulin et al. on Apr. 8, 1975. Both of these patents teach charge distributed within an insulator disposed on a silicon substrate.

The aforementioned G. F. Amelio patent suggests storing negative charge in an oxide layer by using p-type dopants such as boron. However, such dopants appear not to store a negative charge of sufficient stability for as long as is desired for certain devices. The aforementioned Boulin et al. patent teaches forming an electrically alterable memory by introducing charge trapping materials such as tantalum and restricting them to an interface between two different insulation layers disposed on a semiconductor substrate. The layer of material creates sites which can be filled with electronic charge carriers and subsequently emptied under the influence of an electric field applied across the structure. In contrast, there are devices in which it is desired to have negative charge storage which is not electrically alterable and which forms a permanent part of the device.

Fast surface states are known in the prior art and have been considered undesirable in many semiconductor devices. We believe that currently there are no commercial devices dependent on fast surface states because of the difficulty to produce and control them at will. It would be desirable to simplify control and production of fast surface states so that they may then be advantageously employed in semiconductor devices.

It is well known that the orientation of silicon and the mode of oxidation affects the number of fast surface states. However, such fast surface states are temperature sensitive and are affected by annealing. An article entitled "Determination of Deep Energy Levels in Si by MOS Techniques" by W. Fahrner and A. Goetzberger appearing in *Applied Physics Letters*, Vol. 21, No. 7, Oct. 1, 1972, page 329, teaches implanting tantalum into a silicon-silicon dioxide interface and producing fast surface states. However, the article does not teach forming nonannealable fast surface states at full thermal equilibrium. It would be desirable to controllably increase the number of nonannealable fast surface states.

In addition to improving sodium gattering, storing stable negative charge and creating nonannealable fast surface states, it would be desirable to attain these improvements with few and simple processing steps. Further, it would be desirable to develop devices which can advantageously use these improvements.

SUMMARY OF THE INVENTION

To these and other ends, the invention is a semiconductor device and a method for making it. In particular, the method of the invention involves the modification of charge conditions in a wafer comprising a silicon substrate and an overlying silicon dioxide layer by introducing a distribution of suitable material, such as tantalum, into the wafer. Moreover, a distribution of tantalum in the silicon dioxide will store stable negative charge and getter sodium when subjected to electrical and temperature stress. Additionally, a distribution of tantalum at an interface between the silicon dioxide layer and a silicon substrate creates nonannealable fast surface states. Therefore the relative dominance of the three processes for modifying charge conditions depends upon the location of the tantalum distribution.

The tantalum may be distributed either by implanting the tantalum into the silicon dioxide or by implanting the tantalum into a silicon substrate prior to an oxidation step, and in both cases subsequently heating in an oxidizing atmosphere. Both alternatives produce a silicon dioxide layer having a distribution of tantalum. However, implanting into silicon dioxide is advantageous for producing a centrally located distribution of tantalum and implanting into silicon is advantageous for producing distributions of tantalum at both interfaces of the silicon dioxide layer. Alternatively, suitable distributions of tantalum, at both interfaces, can also be achieved by thermal diffusion of tantalum from a tantalum source located at the exposed silicon dioxide surface.

In addition to tantalum, it is believed that niobium and uranium may be used to getter sodium in accordance with an embodiment of this invention. It is also believed that gettering occurs after tantalum, niobium and uranium are incorporated into oxides having cations with the valences $Ta^{5+}$, $Nb^{5+}$ and $U^{6+}$, respectively.

Detailed Description

Figure 1:
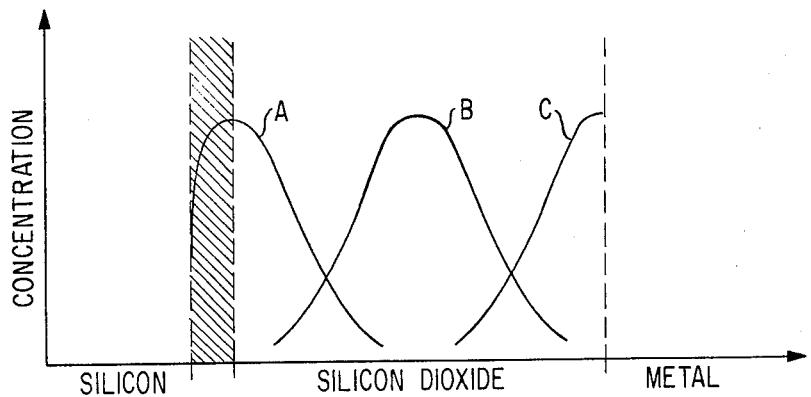
FIG. 1 shows a graphical representation of three useful distributions of treated tantalum in a silicon dioxide layer.

With reference to the drawing, FIG. 1 shows a graphical representation of the profile of three distributions, A, B and C, of tantalum in a wafer comprising a silicon substrate with an overlying genetic silicon dioxide layer and a metal electrode overlying the layer.

While a uniform concentration of tantalum throughout the silicon dioxide layer can produce modifications of charge conditions by all three of the previously described mechanisms, it is often desirable to favor one particular mechanism in a given device application. Accordingly, the three distributions which are illustrated are more suited for emphasizing different ones of the mechanisms than all three of them simultaneously.

When the peak concentration of tantalum is located near the silicon dioxide-silicon substrate interface, as in curve A, the tantalum doped region can be best used to create stable fast surface states at the interface. The accumulation of tantalum at the interface of the silicon dioxide layer and the silicon substrate is not unique, many other impurities also accumulate at that interface transition region (of pure silicon dioxide to pure silicon), which is shaded in FIG. 1. The width of this interface transition region has not yet been measured definitively, but its limits are believed to be between about 10 to 50 A., with the possible extreme limits of between about 3 to 300 A. For example, see the paper by T. W. Sigmon et al. in *Applied Physics Letters*, Vol. 24, No. 3 (Feb. 1, 1974), pp. 105-107, entitled: "Stoichiometry of Thin Silicon Oxide Layers on Silicon." However, in order to simplify the further description of the invention, the term "interface" of the silicon dioxide layer with the silicon substrate will be used to locate a position as determined by optical thickness measurements techniques, such as ellipsometry, wherein the silicon dioxide layer interfaces the silicon substrate on the assumption of an abrupt transition rather than a more continuous transition of pure silicon dioxide to pure silicon substrate as indicated by the shaded area in FIG. 1. When the peak concentration of tantalum in the silicon dioxide is located in the bulk of the silicon dioxide, as in curve B, the tantalum doped region can be best used to store negative charge after electrical and temperature stressing. Finally, when the peak concentration of tantalum in the silicon dioxide is located near the electrode-silicon dioxide interface, as in curve c, the tantalum doped region can be best used as a sodium getter during electrical and temperature stressing.

Although it should be understood that an exact scientific theory of this invention is not essential to the successful operation thereof, it is believed that after tantalum ions are implanted and exposed to an oxidizing atmosphere, a region of "oxidized" tantalum is formed in the silicon oxide layer. It is believed that the fast surface states are related to oxidized tantalum in the silicon dioxide-silicon interface. After applying electrical and temperature stressing to the silicon dioxide layer, some of the oxidized tantalum located in the bulk can store negative charge. When the tantalum doped region acquires a negative charge, electrostatic trapping of mobile positively charged sodium ions takes place in the presence of electrical and temperature stressing.

Because of some uncertainty as to the exact nature of the tantalum after the various treatments it experiences after introduction, it will be helpful to describe the resultant as tantalum in one or more of its oxidation states indicating that the tantalum is sharing bonds with one or more oxygen atoms. The oxidized tantalum is believed to be incorporated into the silicon dioxide molecular structure in the form of multiple tantalum-oxygen-silicon bonds. Such bonds are very stable, and therefore the oxidized tantalum is essentially immobile, even at temperatures as high as 1,100° C. There may also remain some tantalum in its metal state.

Depending upon the particular distribution of the tantalum desired in the silicon dioxide layer, it is advantageous either to implant the tantalum into the silicon dioxide layer or to implant the tantalum into the silicon and then oxidize the silicon. If the tantalum is implanted into the silicon dioxide a subsequent reaction in oxidizing condition, such as with dry oxygen at about 1,100° C, is useful to incorporate substitutionally the tantalum into the silicon dioxide lattice, which appears to be desirable.

An illustrative example of the formation of a distribution of tantalum in the silicon dioxide layer particularly suitable for negative charge storage will now be discussed. Such a distribution of tantalum is illustrated in FIG. 1, curve B. The silicon dioxide layer is formed by oxidizing a p-type silicon substrate at about 1,100° C in dry oxygen to grow about 900 A. of silicon dioxide film. Tantalum ions are implanted, at concentrations of between $10^{13}$ and $1.5 \times 10^{15}$ per square centimeter, and preferably over $5 \times 10^{14}$ per square centimeter, into the silicon dioxide layer. The implantation energy is 50 keV. The resulting distribution (before a subsequent oxidation) is Gaussian. The peak in tantalum concentration in this distribution is located at about 440 A. from the then exposed silicon dioxide surface, and the half-width of the distribution (that is, at one-half the peak concentration) is about ±50 A. (total of 100 A. width). After implantation, the resultant wafer is further oxidized in dry oxygen at about 1,100° C, which grows an additional 100 A. of silicon dioxide film (to a total of 1,000 A.) and treats the tantalum. The location of the peak of the tantalum distribution is unaffected by this further oxidation, but the profile of the tantalum distribution is broadened to a half-width of about ±140 A. (total width of about 300 A.). About 75 percent of the total implantation dose of tantalum atoms is contained within a region in the silicon dioxide whose two boundaries are located (after oxidation) at about 300 and 580 Angstroms, respectively, from the then exposed silicon dioxide surface. Hence, for a 1,000 A. silicon dioxide layer, this region containing about 75 percent of the total implantation dose has its two boundaries located at about 700 and 420 A., respectively, from the silicon dioxide-silicon substrate interface. The peak concentration of tantalum in this distribution is about $3 \times 10^{19}$ per cubic centimeter for a dose of tantalum of about $10^{14}$ per square centimeter, and is about $5 \times 10^{20}$ per cubic centimeter for a tantalum dose of about $1.5 \times 10^{15}$ per square centimeter. The resulting wafer can then be annealed in a non-oxidizing atmosphere such as helium, or nitrogen at 1,100° C.

After such processing, the tantalum resides almost entirely in the bulk of the silicon dioxide layer with little at either interface, that is, less than about 0.1 percent of the total tantalum implant dose. It is possible to accumulate negative charge in the tantalum doped region by subjecting the wafer to electrical and temperature stress. An example of such a stress is to apply about 10 volts with either polarity at about 300° C for about 1 hour. After the wafer is stressed, the region continues to store a negative charge. The resulting stored electrical charge density is about 0.25 percent of the total implanted tantalum dose. This charge density produces a flat-band voltage shift of about 0.1 volts for a tantalum implant dose of about $10^{13}$ per square centimeter and up to about 7 volts for a dose of $1.5 \times 10^{15}$ per square centimeter, for the case where the peak concentration of the tantalum is located in the center of the silicon dioxide layer. However, the resulting amounts of stored charge, and hence the flat-band voltage shifts, depend upon how long and how strong the electrical stressing is applied; and thus the flat-band voltage shifts would exceed the above values in cases of stronger electrical stressing. Since a shift of 0.1 volt in the flat-band voltage is at the threshold of significant flat-band voltage shifts, the advantageous tantalum implant dose should be at least about $5 \times 10^{13}$, and preferably of the order of at least $5 \times 10^{14}$ per square centimeter.

Choice of the location of the negative charge in the silicon dioxide layer is affected by both tunneling considerations and the desired magnitude of the electric field at the silicon-silicon dioxide interface. The magnitude at the interface of the electric field produced by the charge distribution increases as the distance between the interface and the tantalum rich region decreases. Such an electric field is often desirable to modify the threshold voltage in an MOS transistor. However, the tantalum rich region cannot be moved arbitrarily close to the silicon interface because at very small distances the stored electrons have a tendency to tunnel through the intervening silicon dioxide to the silicon-silicon dioxide interface and thereby deplete the amount of negative charge stored. The tantalum-rich region in the oxide, including 140 A. of oxide on either side of the peak of the tantalum profile, contains about 75 percent of the total tantalum in the oxide after the oxidation process described above. The location of this peak in the tantalum concentration profile should advantageously be kept more than about 300 A. from the interface of the silicon dioxide layer with the silicon substrate if such tunneling of electrodes is to be kept insignificant.

If electrical and temperature stressing is continued after negative charge is stored as described above, sodium gettering can occur. Positively charged mobile sodium ions to the extent present in the wafer are attracted to the negative charge distribution. Since it is difficult to exactly match the number of negative charges stored with the number of mobile positive sodium ions, an excess of tantalum is usually implanted when substantially complete sodium gettering is desired. However, if it is desired to keep low the electric field at the interface due to the excess negative stored charge, the location of the peak in the tantalum concentration profile in the tantalumrich region should be located from bout 3 A. to less than about 100 A. from the silicon dioxide-metal interface, and should thus be kept at the largest feasible distance from the interface of the silicon dioxide layer with the silicon substrate.

A tantalum distribution such as curve C in FIG. 1 is particularly advantageous when sodium gettering is desired. A distribution such as curve C can be formed by electron beam evaporation or chemical vapor deposition of tantalum on the surface of a silicon dioxide film, followed by a thermal diffusion of tantalum into the silicon dioxide layer. Electron beam evaporation deposits tantalum on the silicon dioxide surface. A typical concentration of tnatalum atoms is about $10^{14}$ to $2 \times 10^{15}$ per square centimeter, preferably about $10^{15}$ to $1.5 \times 10^{15}$ per square centimeter, in a 1,000 A.-thick silicon dioxide layer. Typically, the heating is performed at about 1,100° C for about 10 minutes in dry oxygen. This heat treatment causes the tantalum to diffuse into the surface of the silicon dioxide layer and oxidizes the tantalum. As a result of this treatment, 75 percent of the tantalum atoms will reside in the region of oxide penetrating about 100 A. from the exposed silicon dioxide surface, at an average tantalum concentration of about $10^{21}$ atoms per cubic centimeter. The concentration profile of the resulting distribution of tantalum is approximately in the form of a one-half Gaussian distribution, as shown in curve C of FIG. 1. Chemical vapor deposition typically involves heating materials such as oxygen, tantalum chloride and silicon chloride to form on a body of silicon a film comprising a tantalum oxide and silicon dioxide. After the formation of the film, it is exposed to a helium anneal at about 1,100° C for one-half hour.

A distribution such as curve C can also be formed by a shallow ion implantation. For example, tantalum ions can be implanted using an implantation energy of between 1 and 15 keV, resulting in the confinement of more than 75 percent of the total tantalum implant dose to a region which penetrates from the exposed silicon dioxide surface into the silicon dioxide layer for a distance of about 3 to somewhat less than about 100 A., respectively. The implanted material is then subjected to a reaction with dry oxygen at about 1,100° C for about 10 minutes and a helium anneal at about 1,100° C for about one-half hour.

It is believed that niobium and uranium can alternatively be used to getter sodium when this is the principal concern. This is based on the following reasoning. It is convenient for understanding chemical gettering to regard sodium oxide as a base and silicon dioxide as an acid which react together to form sodium silicate (e.g., $Na_2SiO_3$) which is to be thought of as analogous to a sodium center in silicon dioxide. A gettering agent is a substance more acidic than silicon dioxide which will react with sodium silicate to form silicon dioxide and a sodium salt more stable than sodium silicate. The magnitude of the free energy released is a measure of the efficiency of the gettering action. The general chemical gettering equation is $Na_2SiO_3$ + getter = sodium salt of the getter + silicon dioxide + free energy. The equation can be simplified by removing silicon dioxide from both sides. More specifically, the chemical equation using acid oxide getters is $Na_2O$ + acid oxide getter = sodium salt of oxide getter + energy. In the following table the acid oxide is listed in column (1) and the sodium salt formed in column (2). Column (3) is the heat (enthalpy) of reaction at 25° C, and columns (4) and (5)

are the free energies of the reactions at 25° C and 1,127° C, respectively.

TABLE I

Energies of reaction between sodium oxide and acid oxide in kcal/mole $Na_2O$.

$Na_2O(s)$ + Acid oxide(s) = Salt(s) + Energy

| Acid Oxide (1) | Salt Formed (2) | $-\Delta H(298°K)$ per $Na_2O$ (3) | $-\Delta F(298°K)$ per $Na_2O$ (4) | $-\Delta F(1400°K)$ per $Na_2O$ (5) |
|---|---|---|---|---|
| $Ta_2O_5$ | $Na_3TaO_4$ | 120.6* | not available | not available |
| $Nb_2O_5$ | $Na_3NbO_4$ | 113* | not available | not available |
| $UO_3$ | $Na_2UO_4$ | 110.6 | 112.6 | 127.2 |
| $MoO_3$ | $Na_2MoO_4$ | 71.1 | 71.7 | 75.6 |
| $As_2O_5$ | $Na_3AsO_4$ | 71.1 | not available | not available |
| $SiO_2$ | $Na_2SiO_3$ | 70.2 | 69.8 | 67.8 |
| $WO_3$ | $Na_2WO_4$ | 68.9 | 69.4 | 76.2 |

*estimated

The materials below the dotted line are less acidic than is silicon dioxide to sodium oxide and are not predicted to be effective sodium getters.

Another embodiment of this invention involves forming tantalum distributions at the two interfaces of the silicon dioxide layer. Tantalum ions are implanted at dose levels in the range of about $10^{14}$ to $10^{15}$ per square centimeter, typically about $5 \times 10^{14}$ per square centimer, into a bare silicon substrate. A typical implantation energy is 50 keV. After implantation, the surface of the silicon substrate is cleaned and then oxidized to grow about 1,000 A. of silicon dioxide, whereby all of the originally tantalum-implanted region in the silicon substrate, as well as more of the silicon substrate, will be converted to the oxide. The initial distribution of tantalum in the silicon, which is approximately Gaussian, with its peak at 200 A. from the original silicon surface is profoundly affected by the thermal oxidation of silicon. After oxidation of the tantalum, about 98 percent of the total tantalum is located in the silicon dioxide layer in an interface region extending for about 200 A. into the oxide from the exposed silicon dioxide surface. The peak in tantalum concentration is then located at about 100 A. from the exposed surface. A typical tantalum implant dose of about $5 \times 10^{14}$ per square centimeter results in a peak value in the tantalum concentration of about $2.5 \times 10^{20}$ tantalum atoms per cubic centimeter. The values of the peak tantalum concentration range from about $5 \times 10^{19}$ to $5 \times 10^{20}$ tantalum atoms per cubic centimeter for tantalum implant doses in the range of $10^{14}$ to $10^{15}$ per square centimeter. The approximately 2 percent remaining amount of tantalum accumulates in the interface transition region (shaded in FIG. 1) of the silicon dioxide layer and the silicon substrate; whereas trace amounts of the tantalum, believed to be probably less than 0.1 percent of the total tantalum implant dose, are distributed in the bulk of the silicon dioxide layer between these two interface regions containing the above described accumulations of tantalum. As the implant dose of tantalum increases from $10^{14}$ to $10^{15}$ per square centimeter, the concentration of (oxidized) tantalum at the interface of the silicon substrate with the silicon dioxide layer correspondingly also increases. Thus, an implant dose of tantalum atoms in the range of $10^{14}$ to $10^{15}$ atoms per square centimeter results in an interfacial concentration of tantalum in the silicon-silicon dioxide transition interface region in the range of $2 \times 10^{12}$ to $2.4 \times 10^{14}$ tantalum atoms per square centimeter and an average concentration in this interface transition region in the range of about $2 \times 10^{18}$ to $2.4 \times 10^{20}$ tantalum atoms per cubic centimeter.

Accordingly, by implanting into silicon and then oxidizing it is possible to form distributions which approximate curves A and C of FIG. 1. If only curve A is desired, the silicon dioxide containing curve C can be removed by either chemical or mechanical means. A distribution of tantalum in accordance with this embodiment of the invention at the interface of the silicon and silicon dioxide produces nonannealable fast surface states.

Figure 2:
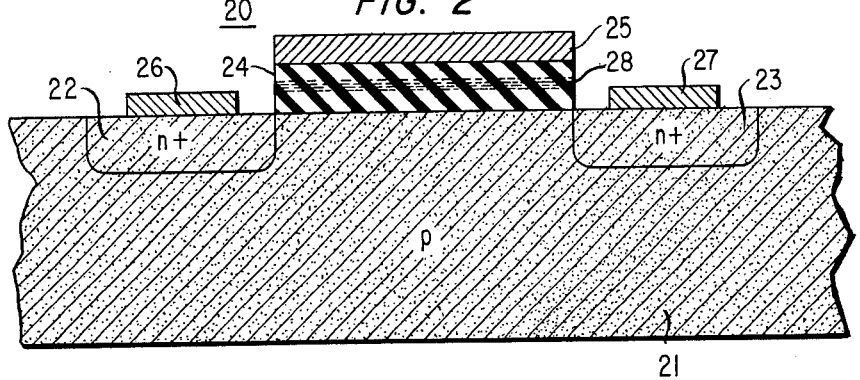
FIG. 2 shows a cross-section of an insulated gate n-channel field effect transistor (IGFET) in accordance with an embodiment of this invention.

A preferred embodiment of the invention utilizes a tantalum distribution to store negative charge in an n-channel MOS device. In particular, FIG. 2 shows an IGFET 20 in accordance with an embodiment of this invention. The transistor comprises a silicon substrate 21 whose bulk is p-type and which includes n-type source and drain regions 22 and 23, respectively. A genetic silicon dioxide layer 24 about 1,000 A. thick modified to include a tantalum-rich region 28 in any of the ways previously discussed overlies the gate region between the source and drain regions. Region 28 overlies and is coextensive with the gate region. Electrodes 25, 26 and 27 serve as the gate, source and drain electrodes, respectively. The tantalum-rich region 28 is characterized by a peak in tantalum concentration which is located in the silicon dioxide layer at about 300 to 500 or 600 A. from the interface of the silicon dioxide layer and the silicon substrate. Region 28 contains an approximately Gaussian distribution of tantalum in the silicon dioxide after oxidation and annealing. The boundaries of the region 28 can be defined as determined by a pair of outermost limits, symmetrically located with respect to the peak in the tantalum distribution, such that just 75 percent of the total tantalum dose is included in this tantalum-rich region 28, while the remaining 25 percent of the total tantalum dose is located in the oxide outside of this tantalum-rich region. As thus defined, the thickness of the tantalum-rich region 28 is at least about 100 A., typically about 280 A., advantageously at least 200 A., and preferably at least about 250 A. but less than about 500 A.

In other respects, the transistor resembles the usual form and any of the known techniques suitable may be used for its fabrication.

Such a structure can be distinguished from those described in the aforementioned Boulin et al. patent in a number of respects. First, in the instant structure the tantalum-rich region 28 normally would be considerably thicker in the direction normal to the channel region. Additionally, in our structure, the insulating layer 24 will comprise a single layer of silicon dioxide rather than two layers of different materials.

It is common knowledge that the threshold voltage of such an IGFET 20 device would have tendencies to be undesirably negative if a conventional silicon dioxide layer were used. This is due from characteristic positive charges at the silicon-silicon dioxide interface, from positive charges associated with unavoidable sodium contamination and from a tendency of the p-type conductivity impurities used in the substrate to migrate during oxidation towards and get lost in the silicon dioxide. Forming negative charge in the silicon dioxide permits raising the threshold voltage. Having a higher threshold voltage better controls channel formation.

In particular, from the previous discussion, it can be appreciated that in such a device it is advantageous that the tantalum-rich region be localized in the bulk of the silicon dioxide layer. Further, it is especially desirable to keep insignificant the amount of tantalum introduced into the silicon substrate to avoid the introduction therein of undesirable fast surface states. For this reason, it is advantageous to have the closest boundary of tantalum-rich region be at least about 100 A. from the silicon interface.

Figure 3:
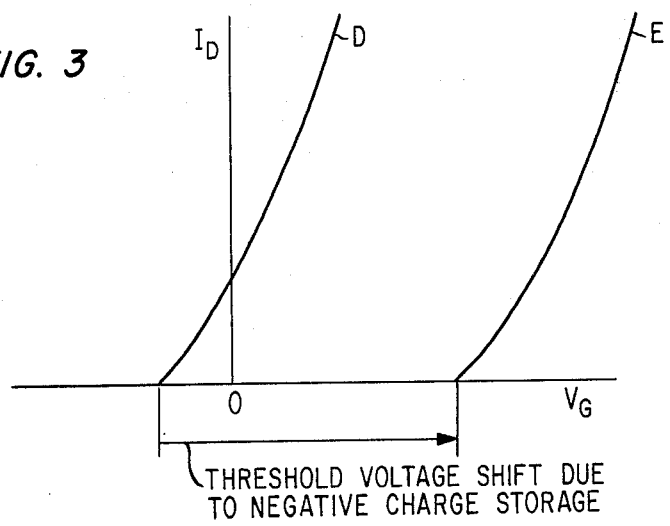
FIG. 3 shows a graphical representation of the threshold voltage shift in an IGFET due to negative charge storage in accordance with an embodiment of this invention.

FIG. 3 shows a graphical representation of the relationship of the drain current ($I_D$) and the gate voltage ($V_G$) of an IGFET. Curve D shows a typical relationship without negative charge storage. Negative charge storage causes a shift to the right and a more positive gate voltage as shown by curve E.

Another application of this invention involves the prevention (channel stopping) of undesirable n-channel formation in the field oxide regions of silicon integrated circuits in the case of n-channel circuits. As previously discussed, the centrally distributed (curve B) type of tantalum distribution, when negatively charged, raises the threshold voltages for channel formation; and thus such a tantalum distribution, localized in the field oxide, can be used for the purpose of channel stopping in integrated circuits.

Another possible application of this invention uses a tantalum distribution at the interface between a silicon dioxide layer and silicon substrate. The distribution creates nonannealable fast surface states which can be used to create a charge sink without an external connection. Such a sink can be useful at the terminus of a charge carrier path in a charge transfer device.

It should also be appreciated that the invention can be used with various other devices when it is advantageous to getter sodium which may undesirably be present in the device. In such an application, tantalum may be used in the gate insulation of a p-channel MOS transistor simply to getter sodium.

Various other modifications and variations will no doubt occur to those skilled in the various arts to which this invention pertains. For example, the introduction of the tantalum, niobium or uranium can be accomplished by various combinations of implantation, diffusion, chemical vapor deposition and other such fabrication techniques. The structures using a tantalum, niobium or uranium distribution may also have a wide variety of geometries. The semiconductor material in the MOS structure may be one other than silicon. Of course, the invention is applicable to large scale integration (LSI) and medium scale integration (MSI) arrays.

What is claimed is:

1. A semiconductor device comprising a silicon semiconductor substrate of a first conductivity type, a pair of spaced impurity zones of a second conductivity type formed into the substrate, a layer of silicon dioxide contacting the substrate and overlying the space between the impurity zones, a layer of metal contacting the silicon dioxide layer, and having a distribution of tantalum in one of its oxidation states in the silicon dioxide layer, said distribution characterized by a peak in the silicon dioxide layer and by a concentration of tantalum in the silicon dioxide layer in the range between about $10^{13}$ and $1.5 \times 10^{15}$ per square centimeter.

2. The device of claim 1 in which the concentration of tantalum is in the range of about $10^{14}$ to $1.5 \times 10^{15}$ per square centimeter.

3. A device as recited in claim 1 wherein the distribution of tantalum is confined in the bulk of the silicon dioxide layer such that the peak is located at a distance greater than about 100 A. from the semiconductor-silicon dioxide interface.

4. A device as recited in claim 1 wherein more than 75 percent of the tantalum is confined in the silicon dioxide within less than about 100 A. of the interface between the metal and the layer of silicon dioxide.

5. An insulated gate field effect transistor device comprising a silicon wafer which includes n-type source and drain zones separated by a p-type gate region
characterized in that the gate insulator overlying the gate region consists of a silicon dioxide layer having within its bulk a sub-region which is rich in tantalum, said tantalum being in a distribution, substantially confined to the sub-region, which has a peak in said silicon dioxide layer, said distribution characterized by a concentration of tantalum in the range of about $10^{13}$ to $1.5 \times 10^{15}$ per square centimeter.

6. The device of claim 5 in which the concentration of tantalum is in the range of $10^{14}$ to $1.5 \times 10^{15}$ per square centimeter.

7. An n-channel insulated gate field effect transistor device comprising a silicon wafer which includes source and drain zones separated by a gate region
characterized by the improvement that the gate insulator overlying the gate region comprises a layer of genetic silicon dioxide which includes confined within its bulk a distribution of tantalum in a concentration of between about $10^{13}$ and about $10^{15}$ atoms per square centimeter forming a tantalum-rich region in the layer of silicon dioxide.

8. The device of claim 7 in which the concentration of tantalum is in the range between $5 \times 10^{13}$ and $1.5 \times 10^{15}$ per square centimeter.

9. The device of claim 8 which is further characterized in that the peak of the tantalum concentration in said tantalum-rich region is located at least about 300 A. from the silicon-silicon dioxide interface.

10. The device of claim 8 in which more than 75 percent of the tantalum is confined within a sub-region of width in the silicon dioxide layer in the range between about 200 and 500 A.

11. The device of claim 7 further characterized in that said tantalum-rich region has a peak magnitude of tantalum concentration of the order of about $5 \times 10^{20}$ tantalum atoms per cubic centimeter and a total width at one-half the magnitude of the peak of about 300 A.

12. An insulated gate field effect transistor device comprising:
a p-type silicon substrate,
n-type source and drain zones formed into the silicon substrate and separated by a p-type gate region, a layer of genetic silicon dioxide about 1,000 A. thick overlying the p-type gate region, a layer of metal on the silicon dioxide layer, and a tantalum-rich region within the bulk of the silicon dioxide layer which includes tantalum in one of its oxidation states, said tantalum-rich region having a thickness, defined by inclusion of 75 percent of the tantalum in the oxide layer, of at least 100 A. in the direction normal to the interface of the layer of silicon dioxide and the silicon substrate, said tantalum-rich region being coextnsive with the gate region and having a peaked tantalum distribution, essentially Gaussian in shape, with a peak concentration in the range of about $5 \times 10^{20}$ to about $3 \times 10^{19}$ tantalum in one of its oxidation states per cubic centimeter, said peak being located at least 300 A. from the silicon-silicon dioxide interface.

* * * * *